(12) United States Patent
Glover

(10) Patent No.: US 9,765,838 B2
(45) Date of Patent: Sep. 19, 2017

(54) COMPOSITE LEAF SPRING AND METHOD OF MAKING SAME

(75) Inventor: Andrew James Glover, Belle River (CA)

(73) Assignee: THUNDER COMPOSITE TECHNOLOGIES LTD., Windsor, ON (CA)

( * ) Notice: Subject to any disclaimer, the term of this patent is extended or adjusted under 35 U.S.C. 154(b) by 582 days.

(21) Appl. No.: 13/991,999

(22) PCT Filed: Dec. 6, 2011

(86) PCT No.: PCT/CA2011/050751
§ 371 (c)(1),
(2), (4) Date: Oct. 24, 2013

(87) PCT Pub. No.: WO2012/075582
PCT Pub. Date: Jun. 14, 2012

(65) Prior Publication Data
US 2014/0042680 A1  Feb. 13, 2014

Related U.S. Application Data

(60) Provisional application No. 61/420,085, filed on Dec. 6, 2010.

(51) Int. Cl.
| F16F 1/18 | (2006.01) |
| F16F 1/368 | (2006.01) |
| H01L 41/18 | (2006.01) |

(52) U.S. Cl.
CPC ............ *F16F 1/368* (2013.01); *F16F 1/3686* (2013.01); *H01L 41/183* (2013.01); *Y10T 29/49611* (2015.01); *Y10T 29/49801* (2015.01); *Y10T 29/49826* (2015.01); *Y10T 29/5145* (2015.01)

(58) Field of Classification Search
CPC ......... F16F 1/368; F16F 1/3686; B29C 43/32; B29C 53/564; B29C 70/081; B29C 70/24; B60G 11/04; B60G 11/02; Y10T 29/49611; Y10T 29/54145; Y10T 29/49826; Y10T 29/49801; H01L 41/183
USPC ............... 267/158, 36.1, 47, 148, 160, 260; 29/896.9, 896.91, 419.1, 428, 564.8; 156/141, 153, 169, 172, 180, 245
See application file for complete search history.

(56) References Cited

U.S. PATENT DOCUMENTS

| 3,900,357 | A |   | 8/1975 | Huchette et al. | |
| 4,519,591 | A | * | 5/1985 | Bush | B29C 69/002 267/148 |
| 4,659,071 | A | * | 4/1987 | Woltron | B60G 11/12 156/169 |
| 4,707,317 | A | * | 11/1987 | Epel | B29C 70/081 156/180 |

(Continued)

FOREIGN PATENT DOCUMENTS

| EP | 0099196 A1 | 1/1984 |
| EP | 0134617 A1 | 3/1985 |

*Primary Examiner* — Pamela Rodriguez
(74) *Attorney, Agent, or Firm* — Hill & Schumacher

(57) ABSTRACT

A leaf spring manufactured from composite material has a variable cross sectional area. The leaf spring is manufactured by die forming a core of a constant cross section, then winding fibers onto the core to create a spring with a variable cross section and then cutting the spring to size. A ply lay-up station is shown which winds fiber onto a die formed workpiece as it moves through the station.

13 Claims, 14 Drawing Sheets

(56) References Cited

U.S. PATENT DOCUMENTS

| | | | | |
|---|---|---|---|---|
| 4,747,898 | A * | 5/1988 | Woltron | B29C 43/32 |
| | | | | 156/153 |
| 4,749,534 | A * | 6/1988 | Robertson | B29C 53/564 |
| | | | | 156/172 |
| 4,786,033 | A * | 11/1988 | Kofler | F16F 1/368 |
| | | | | 156/141 |
| 4,802,659 | A | 2/1989 | Hope | |
| 4,894,108 | A * | 1/1990 | Richard | B29C 70/24 |
| | | | | 156/245 |
| 6,422,540 | B1 | 7/2002 | Pfletschinger et al. | |
| 8,925,909 | B2 * | 1/2015 | Drabon | B60G 11/04 |
| | | | | 267/148 |
| 8,950,766 | B2 * | 2/2015 | Schonen | B60G 11/02 |
| | | | | 280/124.17 |

* cited by examiner

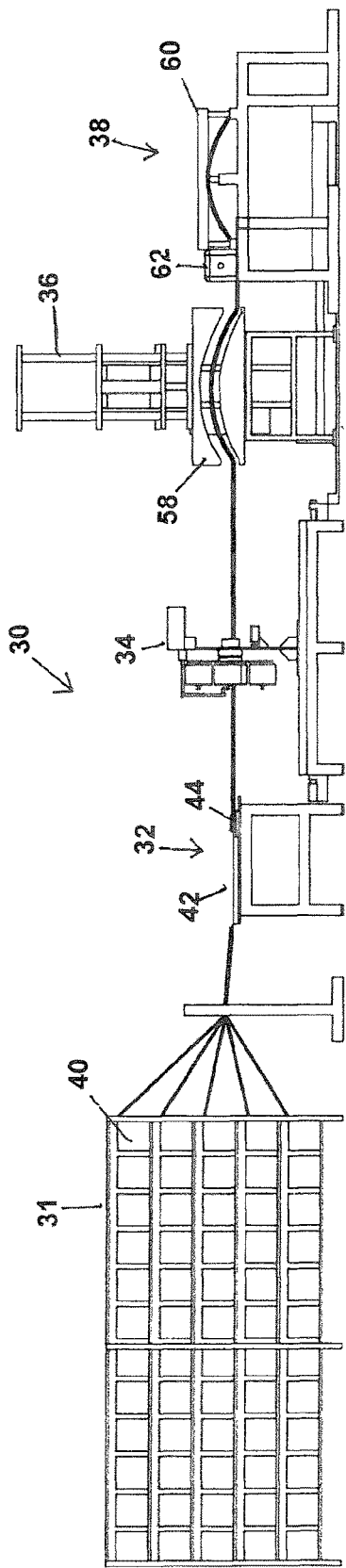
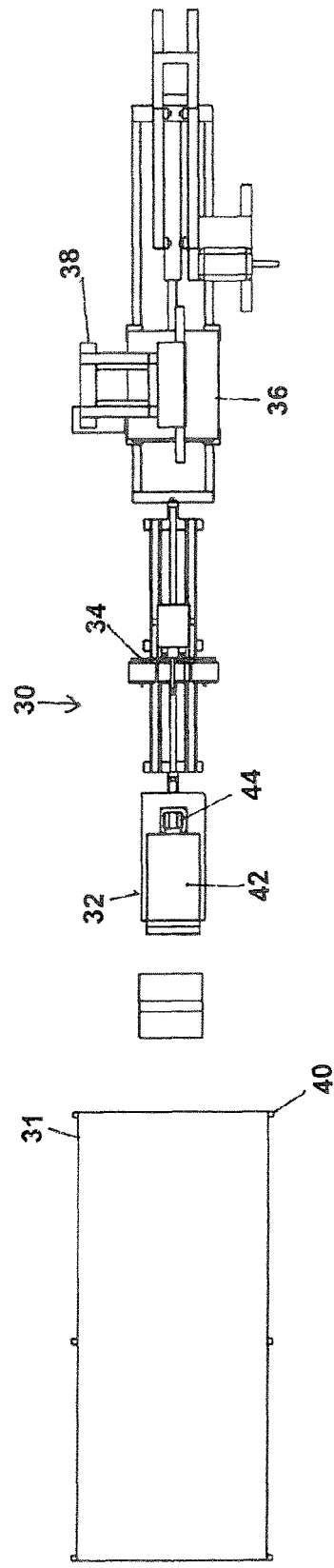
FIG. 7
FIG. 8

COMPOSITE LEAF SPRING AND METHOD OF MAKING SAME

CROSS-REFERENCE TO RELATED APPLICATION

This application is a National Phase application claiming the benefit of the international PCT Patent Application No. PCT/CA2011/050751 filed on Dec. 6, 2011, in English, which further claims priority to U.S. Provisional Application No. 61/420,085 filed on Dec. 6, 2010, the entire contents of which are incorporated herein by reference.

FIELD OF THE INVENTION

This invention relates to leaf springs and particularly, composite leaf springs having a variable cross section and a method of making same.

BACKGROUND OF THE INVENTION

The automotive industry is currently under a lot of scrutiny when considering the materials used in a vehicle and the efficiency of a vehicle. The weight of a vehicle can have an impact on its efficiency. Therefore if new products can be developed that reduce the weight of a vehicle this provide an advantage during the manufacturing of the vehicle when those parts are shipped and it also reduces the cost to operate the vehicle.

Leaf springs perform an important function in a vehicle, particular in regard to driving comfort. Specifically, leaf springs function in whole or in part to hold the chassis at ride height; controls the rate at which the chassis rolls; controls the rear end wrap up; controls axle dampening; controls lateral forces such as side load, pan hard, or side bite; controls brake dampening forces; and sets wheel base lengths during acceleration and deceleration.

Steel leaf springs used in vehicles are typically a plurality of stacked steel leaf springs to create a spring pack. The spring packs are hung from the frame rail by shackles (hangers), which allow the springs to flatten out during weight increase or load; the shackles would move or pivot, allowing them to absorb the weight increase. The closer the shackle is to a vertical angle, the higher the effective spring rate. When the shackle is laid back at an angle, it actually becomes a moving link with the spring, and the spring ride will feel softer.

There are a number of limitations to the steel leaf spring packs. For example, during static load, spring leaf packs have friction between the leaves, causing the springs to ride rough over small bumps because the spring must overcome the pack friction before it starts to flex. For example, rolling slowly over a speed bump, at the bottom of the speed bump, the suspension is rigid with no active suspension absorbing any of the impact.

Further disadvantages include the weight, which contributes to poor fuel economy; steel leaf springs have a lower impact strength than composites which attributes to leaf spring failure; steel leaf springs are pre-bent and will naturally loose their arch height causing the vehicles ride height to change; steel leaf springs corrode over time and can cause premature failure of the spring; and steel leaf springs have a lower fatigue life then composite leaf springs.

Accordingly it would be advantageous to provide a leaf spring that is lighter than the comparable steel spring currently being used in many vehicles. Further, it would be advantageous to provide a composite leaf spring.

SUMMARY OF THE INVENTION

The present application relates to a leaf spring manufactured from composite material having a variable cross sectional area.

The variable cross sectional area may be a variable cross sectional thickness. The leaf spring may have a pultruded core. The leaf spring may have a preselected ply pattern around the pultruded core thereby providing a variable cross sectional thickness.

A pair of eyelets may be attached to either end of the composite leaf spring. The eyelets may be manufactured from extruded aluminium or of likewise composite material. The eyelets may include a separate centre bore.

The composite leaf spring may include a pair of plates attached to the composite leaf spring generally wherein the plates are positioned generally in a longitudinal middle of the composite leaf spring.

The composite leaf spring of claim may include a plurality of fibres and the fibres may be chosen from a group consisting of fibreglass, carbon fibre, basalt fibres, ceramic fibres piezoelectric fibres and a combination thereof. The composite leaf spring may have at least a portion of the plurality of fibres include piezoelectric fibres and the piezoelectric fibres are operably connected to a source of electric current.

In another aspect of the application there is provided a method of making a composite leaf spring comprising the steps of: die forming a spring core having a constant cross section; winding fibre onto the spring core to form a spring having a variable cross section; and cutting the spring to a predetermined length.

The method may further include the step of placing the spring in a press mold to form a shaped spring that is shaped in longitudinal axis. The press mold may also mold variable cross section of the spring. The die forming may be conducted through pultrusion.

In a further aspect of the application there is provided a flexible die forming method comprising the steps of: die forming a core having a constant cross section; winding fibre onto the core to make a workpiece of a variable cross section; and cutting the workpiece to a predetermined length.

The die forming may be one of pultrusion and extrusion.

The method may further include the step of placing a workpiece in a press mold to form a shaped workpiece that is shaped in the longitudinal axis. The press mold may also mold the variable cross section of the workpiece.

In a still further aspect of the application there is provided a ply lay-up station for use in a die forming process. The apparatus includes a base being linearly moveable backwardly and forwardly along a longitudinal axis of a workpiece and having a through bore formed therein, the through bore being positioned and sized such that the workpiece can pass therethrough; and at least one ply station rotatably attached to the base whereby each ply station is rotatable around the through bore and each ply station is adapted to receive ply for winding onto the workpiece.

The ply station may be rotably relative to the base. The ply lay-up station may include a wetting device being positioned whereby the ply moves through the wetting device prior to being wound onto the workpiece. The ply lay-up station may include a plurality of ply stations attached to the base. The ply lay-up station may move backwardly and forwardly in a predetermined manner relative to a speed that the workpiece moves through the through bore.

The ply lay-up station may include an individual resin infusion block for each ply station. The play lay-up station may include a mixing system operably connected to the resin infusion block. The mixing system may include a mixing chamber operably connected to sources of resin and hardener and a dispensing nozzle operably connected to the mixing chamber and wherein the dispensing nozzle is operably connected to each individual resin infusion block.

In a further aspect of the application there is provided a manufacturing system including a die forming station; a ply lay-up station including a base being linearly moveable backwardly and forwardly along a longitudinal axis of a workpiece and having a through bore formed therein, the through bore being positioned and sized such that the workpiece can pass therethrough, and at least one ply station rotatably attached to the base whereby each ply station is rotatable around the through bore and each ply station is adapted to receive ply for winding onto the workpiece; and a cutting station.

The die forming station is one of a pultrusion station and an extrusion station. The manufacturing system further includes at least one press mold station after the ply lay-up station. The manufacturing system may include two press mold stations for use in an alternating sequence.

The ply station is rotably relative to the base. The ply lay-up station may include a wetting device being positioned whereby the ply moves through the wetting device prior to being wound onto the workpiece. The ply lay-up station may include a plurality of ply stations attached to the base.

The ply lay-up station may include an individual resin infusion block for each ply station. The play lay-up station may include a mixing system operably connected to the resin infusion block. The mixing system may include a mixing chamber operably connected to sources of resin and hardener and a dispensing nozzle operably connected to the mixing chamber and wherein the dispensing nozzle is operably connected to each individual resin infusion block.

The ply lay-up station moves backwardly and forwardly in a predetermined manner relative to a speed that the workpiece moves through the through bore.

Further features of the invention will be described or will become apparent in the course of the following detailed description.

BRIEF DESCRIPTION OF THE DRAWINGS

The invention will now be described by way of example only, with reference to the accompanying drawings, in which:

FIG. 7 is a side view of the manufacturing system;

FIG. 8 is a top view of the manufacturing system;

DETAILED DESCRIPTION OF THE INVENTION

Figure 1:
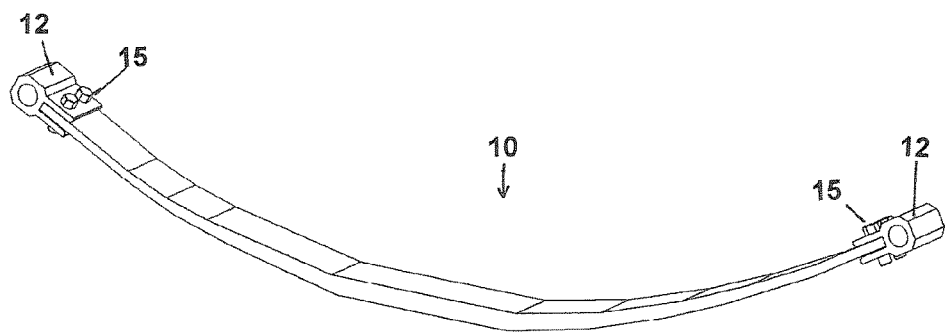
FIG. 1 is a perspective view of a composite leaf spring.
Figure 2:
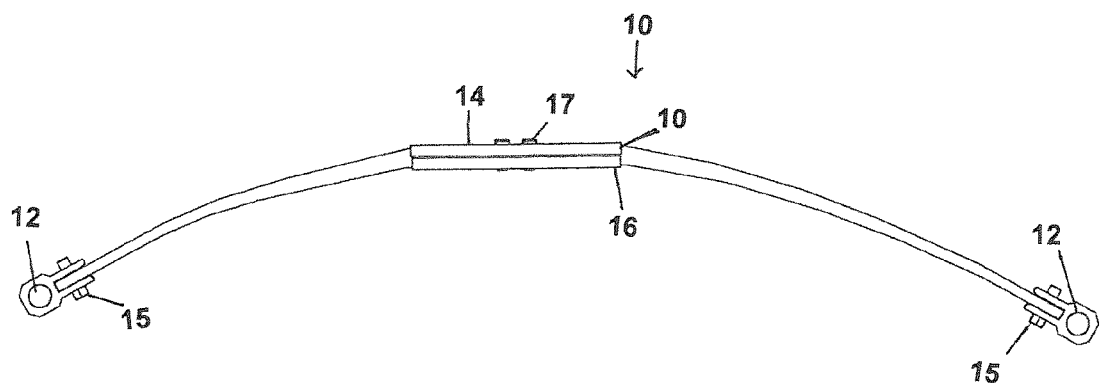
FIG. 2 is a side view of an alternate embodiment of a composite leaf spring.
Figure 3:
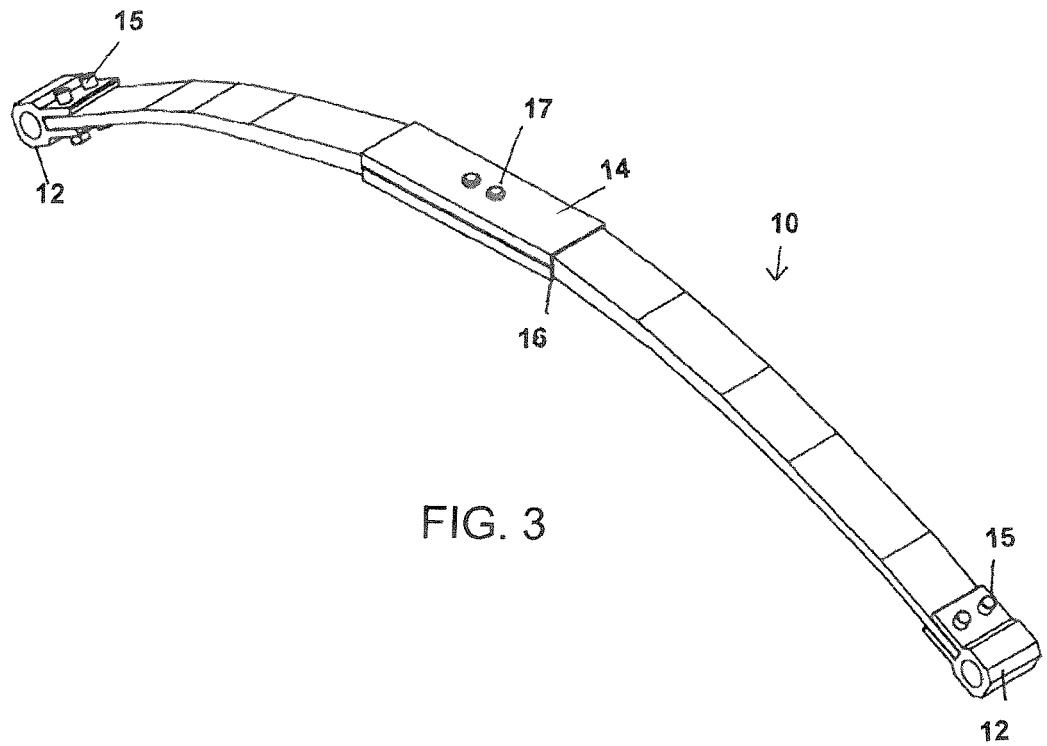
FIG. 3 is a perspective view the composite leaf spring of FIG. 2.
Figure 4:
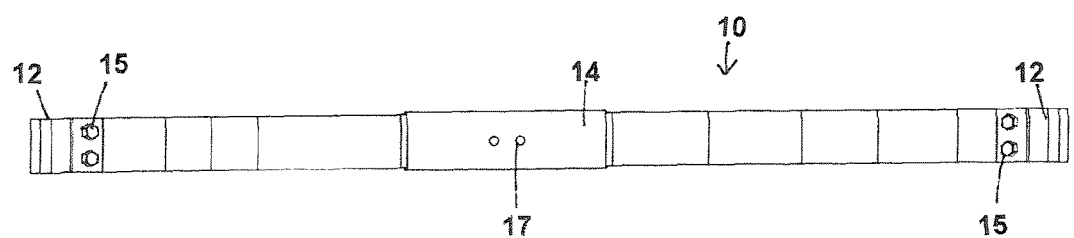
FIG. 4 is a top view of the composite leaf spring of FIGS. 2 and 3.
Figure 5:
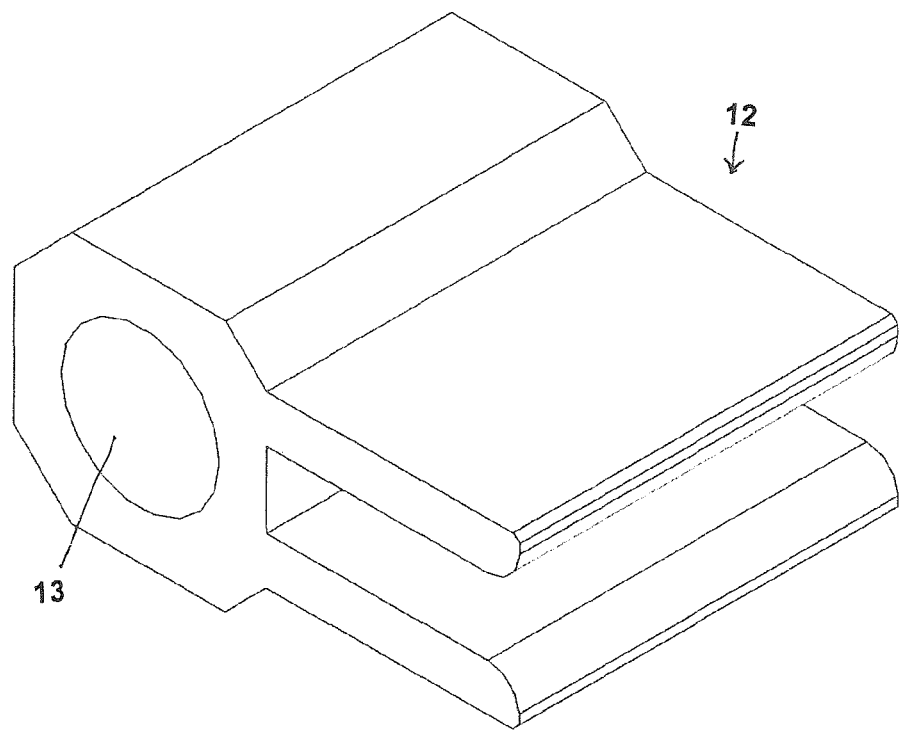
FIG. 5 is an enlarged perspective view of the eyelet that is attachable to the leaf spring.
Figure 6:
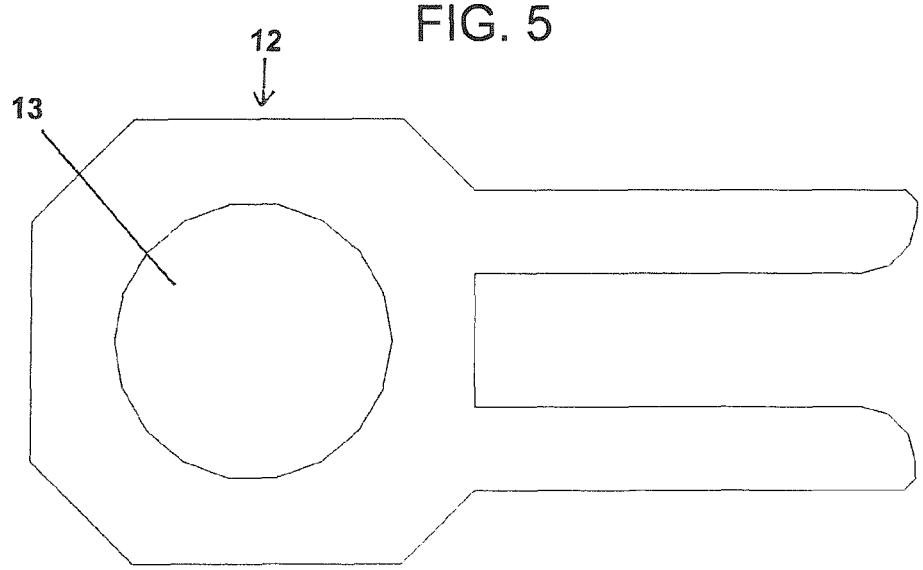
FIG. 6 is an enlarged side view of the eyelet.

Composite materials are lighter, stronger, corrosion resistant and able to withstand the highest temperatures and hostile environments and accordingly they are viewed as good substitute for steel and other metals. Composite technology is currently being employed by the most cutting edge institutions in aerospace, automotive, racing, sport and construction and has quickly become the structural material of the future. There are still many opportunities for improvements in regard to both composite products and methods of manufacture.

The composite leaf spring is shown generally at 10 in FIGS. 1 to 4. Composite leaf spring 10 is manufactured from a composite material having a variable cross sectional area. The variable cross sectional area is a variable cross sectional thickness. The composite leaf spring has a pultruded core with a preselected ply pattern wound around the pultruded core thereby providing a variable cross sectional thickness.

A pair of eyelets 12 is attached to one to either end of the composite leaf spring. Eyelets 12 are attached to the composite leaf sprint 10 with bolts 15. In one embodiment the eyelets may be manufactured from extruded aluminium. Alternatively the eyelets 12 may be manufactured from composite material. In one embodiment the eyelets include a separate centre bore 13.

A pair of plates 14 is attached to the composite leaf spring generally wherein the plates are positioned generally in a longitudinal middle of the composite leaf spring 10 on either side thereof. Each plate 14 has a lip 16 on either side there of so that lip extends over the side of the leaf spring 10. Each plate 14 is attached to the leaf spring with bolts 17

Figure 9:
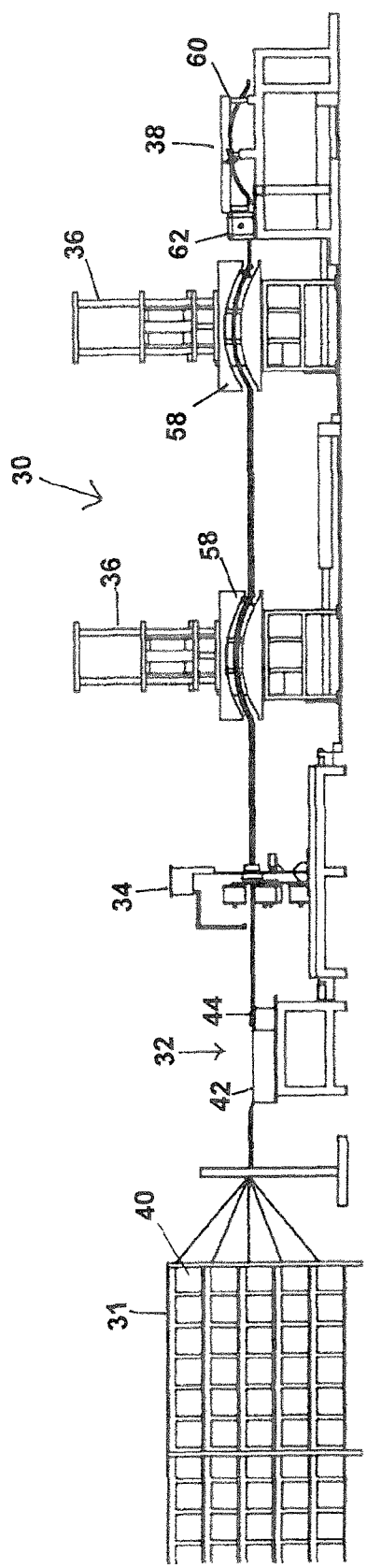
FIG. 9 is a side view of an alternate embodiment of the manufacturing system showing two mold press stations.

The manufacturing system is shown generally at 30 in FIGS. 7 to 9. The manufacturing system 30 includes a roving creel rack 31, a die forming station 32, a ply lay-up station 34; at least one press mold station 36; and a cutting station 38.

The continuous fibreglass rovings 40 are directed into a resin station 42 that saturates the fibres with resin. Once the fibres are wetted out, they continue through a die 44 under a pulling force that creates the general uniform cross section of the spring. This creates a high fibre to resin ratio in the range of 45 to 70 percent dependent on the pulling force. The high fibre ratio creates an extremely strong and light composite structure then other methods of composite manufacturing.

Figure 10:
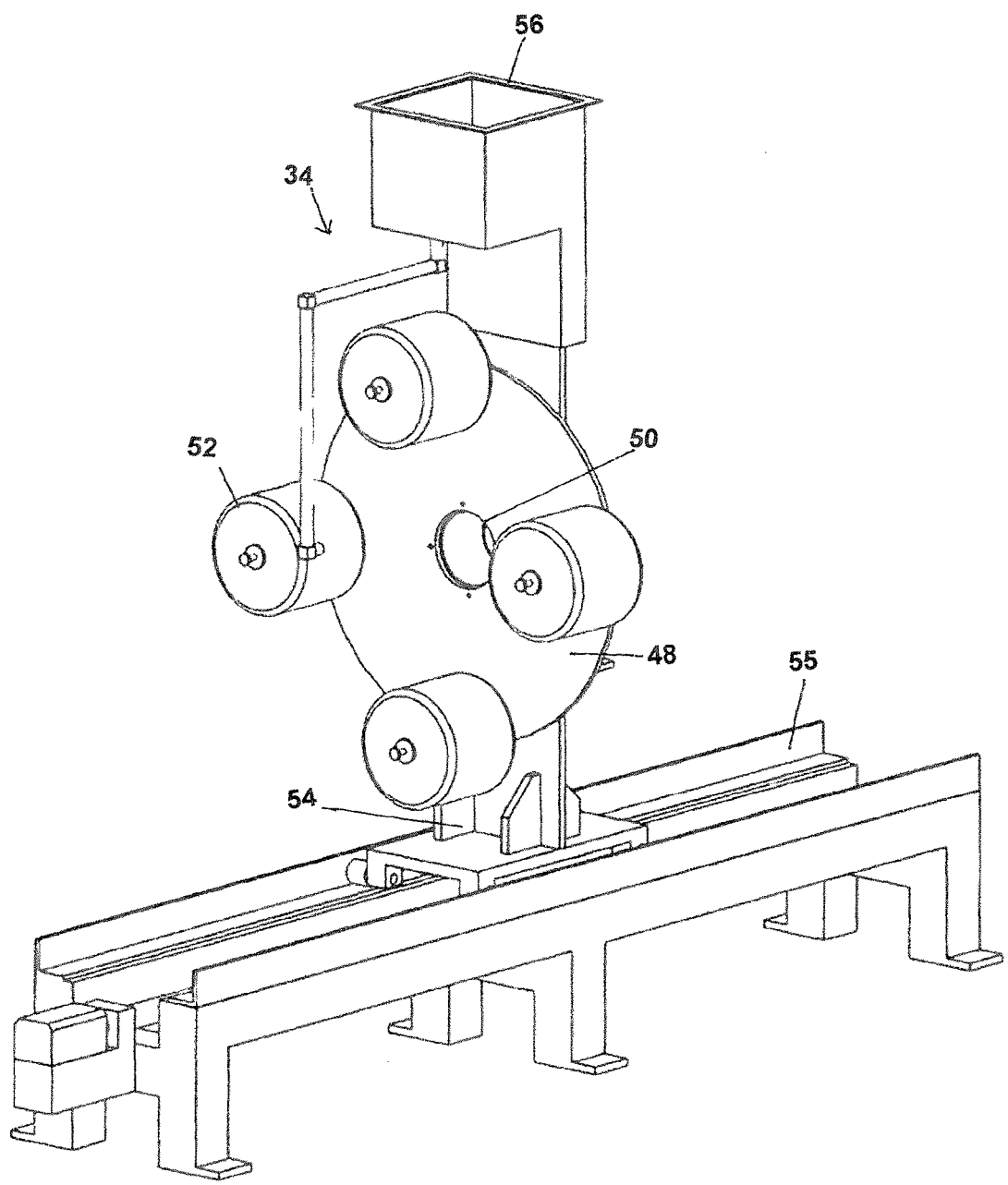
FIG. 10 is a front perspective view of the ply lay-up station of the manufacturing system.
Figure 11:
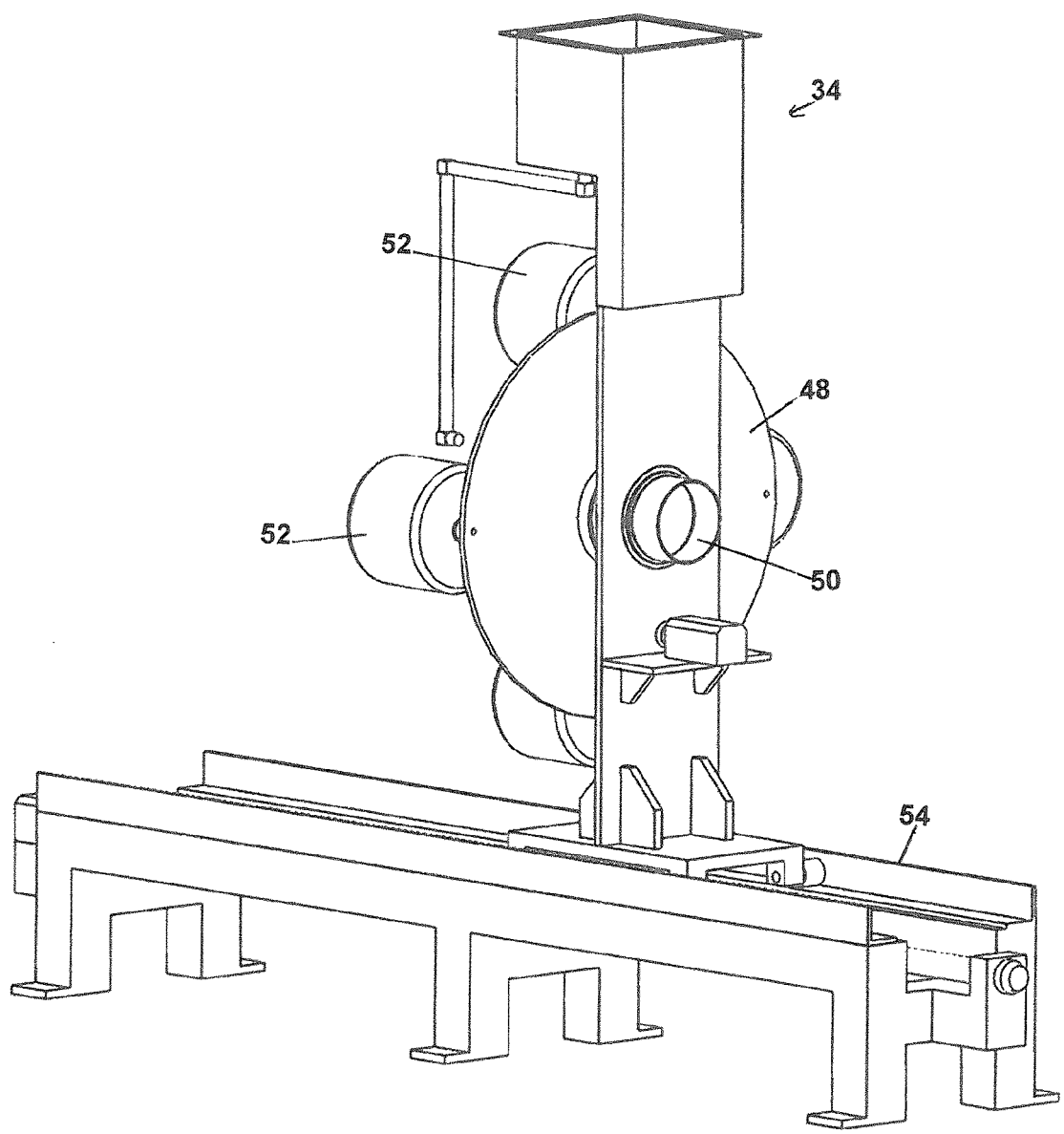
FIG. 11 is a back perspective view of the ply lay-up station.
Figure 12:
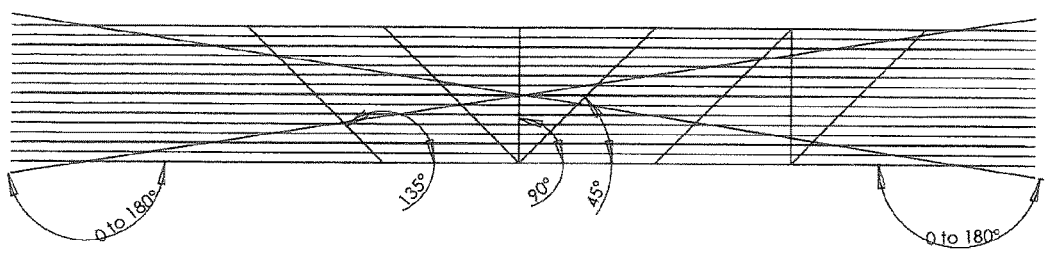
FIG. 12 is a schematic diagram showing possible fibre orientation from the ply lay-up station.

Referring to FIGS. 10 and 11, a tombstone fixture or ply lay-up station 34 travels in the direction of the fibres being pultruded (x-axis). The ply lay-up station 34 has a rotating plate 48 with a through bore 50. The rotating plate 48 is preferably made from aluminium and rotates in the y-axis. The rotating plate 48 has four continuous fibreglass rovings 52 mounted thereon. The rotating plate 48 is controlled using either a stepper motor or servo motor for rotational motion. The tombstone fixture 34 is mounted on a moving base 54 with fixed base frame 55 with a linear guide way so that it can travel back and forth in the X-axis by means of a precision ball screw that is bolted to the bottom of the tombstone fixture 34. The ball screw is connected to a stepper or servo motor and turns the ball screw allowing the fixture to travel along the linear guides in the x-axis.

The thickness of the spring based on distance and thickness is plotted and from this information a cnc controller is programmed to run the tombstone fixture 34. Fibreglass roving is added along the length of the spring section of the pultruded core. This creates a composite part with a variable thickness with the center of the spring being thicker then the ends. The variable thickness spring 10 is designed to obtain a spring rate and load carrying capacity that matches a steel leaf spring yet retains all the advantages of a composite material.

Figure 13:
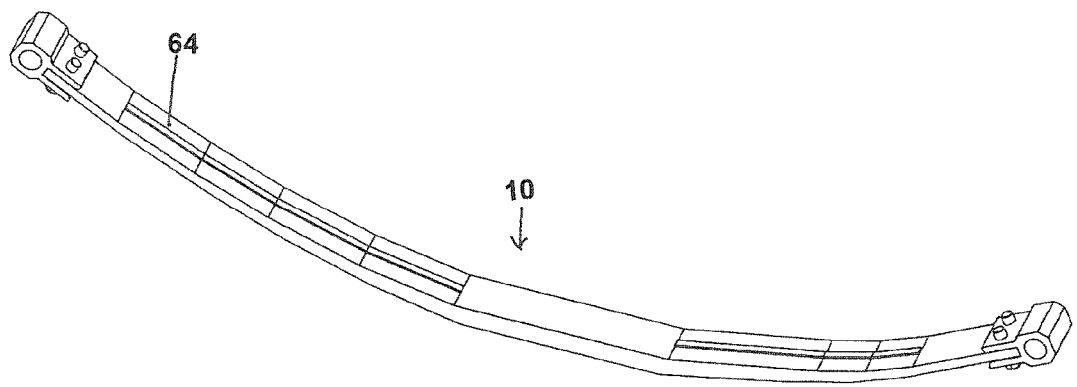
FIG. 13 is another alternate embodiment of the leaf spring and showing an active fibre composite used therewith.

As the aluminum plate 48 rotates in the y-direction, the tombstone 34 itself is traveling in the x-direction. A resin reservoir 56 is attached to the tombstone 34 such that resin is also added to the wet out the rovings being added in the y-axis. The speed of rotation and the speed of the ball screw creates a unique fibre layup with the center fibres running in the longitudinal direction with the outside fibres at various angles to the center fibers from 0 Deg to 90 Deg can be achieved as shown in FIG. 13.

The mold press station 36 similarly travels on the x-axis on linear guides driven by a hydraulic cylinder to achieve the high pulling forces through the die. The mold 58 on the mold press station 36 travels in the z-axis up and down and applies force to give the final parabolic shape of the spring. The mold 58 may be heated to allow for faster cure times of the matrix. When the mold press station 36 is at the home position, a signal from the cnc controller is sent to the mold press station 36 to initiate the closing of the mold 58. Once the mold 58 is closed, the press travels along the x-axis till it reaches the unload position. While the press travels along the x-axis, it is pulling the continuous fibres through the die 44 and the tombstone fixture 34. Once the press indexes to the unload position, either a second mold press station 36 is put in series to increase cycle time and allow the first press to index back to home position while maintaining constant pressure through the die (as shown in FIG. 10), or a fixed clamp station 60 that holds pressure on the fibres while the mold press travels back (as shown in FIGS. 8 and 9).

At the end of the mold press stroke, an automated cut off saw 62 is located along with a pick and place or robot to unload the part from the mold and hold it while the saw cuts.

It will be appreciated by those skilled in the art that the process described herein uses pultrusion, however for certain products it may be advantageous to use the ply lay-up station in association with an extrusion process.

The process shown herein allows the user to manufacture springs in any size or arc length making them ideal for suspension lift kits, helper spring kits, race springs as well as lightweight fuel saving replacements for worn or broken OEM (original equipment manufacturers) springs and for OEM springs on new vehicles. The fibres may be fibreglass, carbon fibre, basalt fibres, ceramic fibres piezoelectric fibres and a combination thereof.

Figure 14:
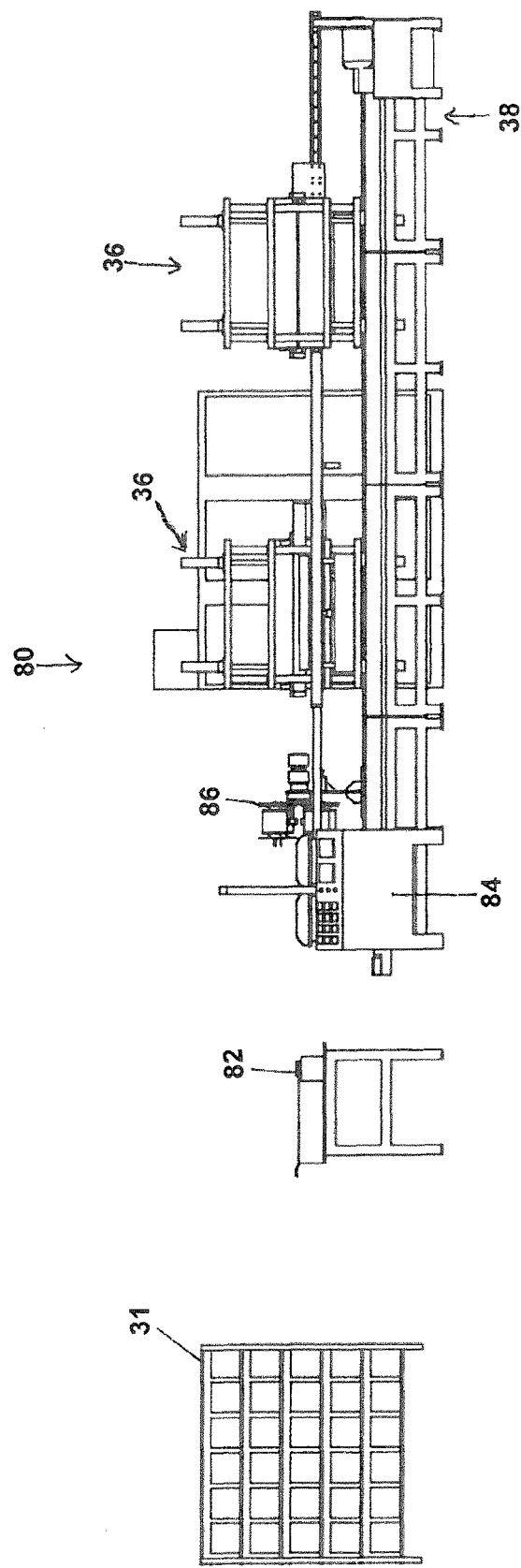
FIG. 14 is an alternate embodiment of a side view of a manufacturing system similar to that shown in FIG. 6 but including an alternate die station and an alternate ply lay-up station.

As shown in FIG. 14, in another embodiment the leaf spring 10 may use Advanced Cerametrics active fiber composite actuators 64 for dampening and stiffening the composite leaf spring. The Piezoelectric actuators are used in conjunction with a microprocessor and amplifier, the AFC actuators counteract forces applied to TCT's composite spring. The AFC actuators are placed in high stress areas in the composite matrix of the leaf spring or coil spring. When road vibrations or changes in forces acting on the spring occur, the system automatically or manually by user input sends a voltage back through the AFC actuators which elongates at half a phase off the vibration frequency created by road conditions and loads. This causes the spring to stiffen and dampen any vibrations.

Figure 15:
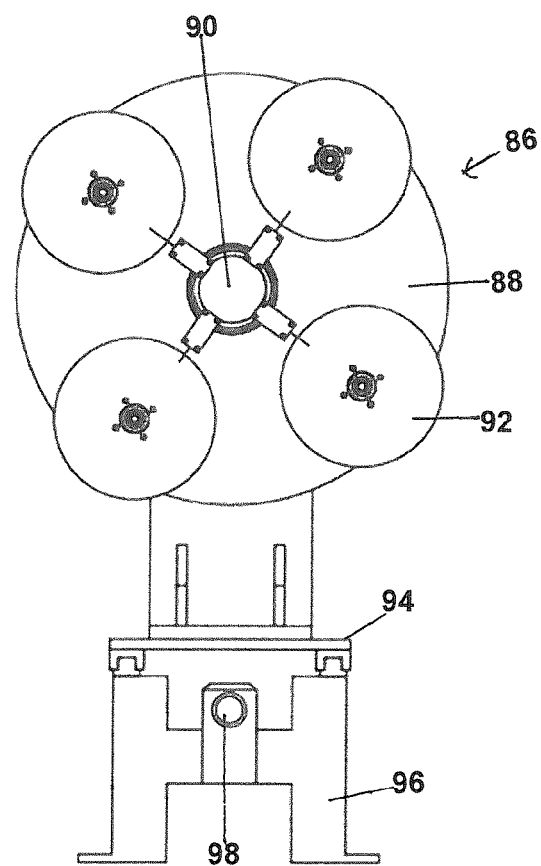
FIG. 15 is a front view of the ply lay-up station of FIG. 13.

Referring to FIG. 15 an alternate manufacturing system is shown generally at 80. Note new reference numbers will only be assigned to those portions of the system 80 which differ from system 30. The manufacturing system 80 includes a roving creel rack 31, a resin station 82, a die forming station 84, a ply lay-up station 86; at least one press mold station 36; and a cutting station 38.

The continuous fibreglass rovings 40 are directed into a resin station 82 that saturates the fibres with resin. Resin station 82 is a closed resin station, in contrast to the open resin station 42. Closed resin station 82 has the advantage that it reduces the resin being oxidized and thus increases the life of the resin and reduces waste resin. Once the fibres are wetted out, they continue through a die 84 under a pulling force that creates the general uniform cross section of the spring. This creates a high fibre to resin ratio in the range of 45 to 70 percent dependent on the pulling force. The high fibre ratio creates an extremely strong and light composite structure then other methods of composite manufacturing. Die station 84 is a computerized die station that automatically adds resin based on Computer input from the programmable logic controller.

Figure 16:
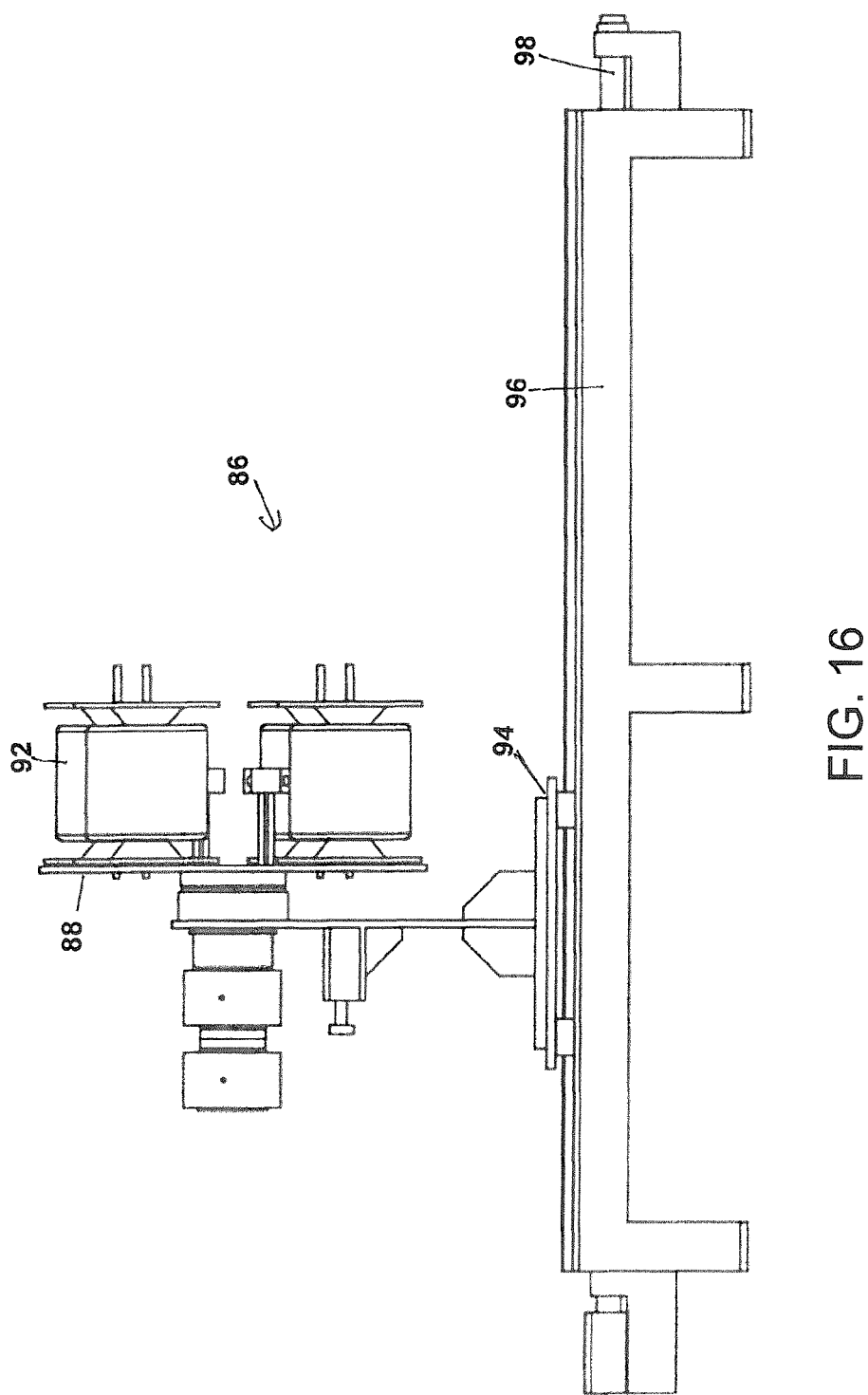
FIG. 16 is a side view of the ply lay-up station of FIG. 14.
Figure 17:
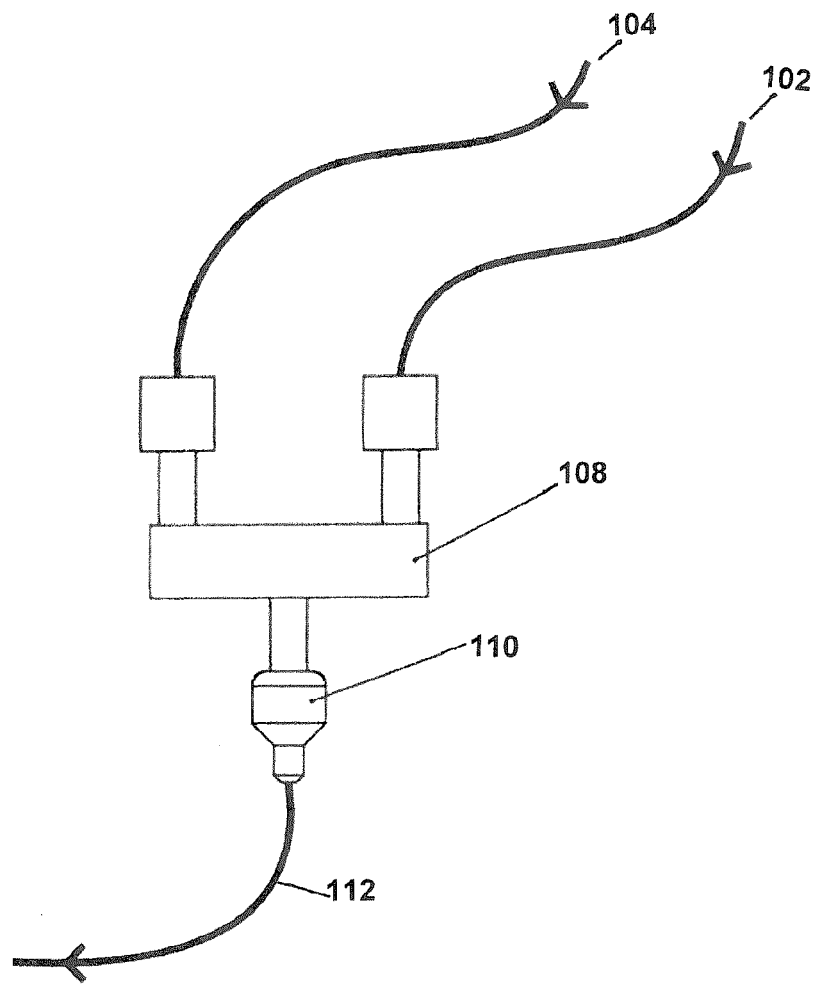
FIG. 17 is a schematic view of the mixing system.

Referring to FIGS. 16 and 17, show an alternate tombstone fixture or ply lay-up station 86 travels in the direction of the fibres being pultruded (x-axis). The ply lay-up station 86 has a rotating plate 88 with a through bore 90. The rotating plate 88 is preferably made from aluminium and rotates in the y-axis. The rotating plate 88 has a plurality of rovings and by way of example as shown herein four continuous fibreglass rovings 92 are mounted thereon. It will be appreciated by those skilled in the art that the number of rovings may be chosen by the use and it may be be configured to have more rovings then four on the winding plate. The rotating plate 88 is controlled using either a stepper motor or servo motor for rotational motion. The tombstone fixture 86 is mounted on a moving base 94 with fixed base frame 96 with a linear guide way so that it can travel back and forth in the X-axis by means of a precision ball screw that is bolted to the bottom of the tombstone fixture 98. The ball screw is connected to a stepper or servo motor and turns the ball screw allowing the fixture to travel along the linear guides in the x-axis.

Figure 18:
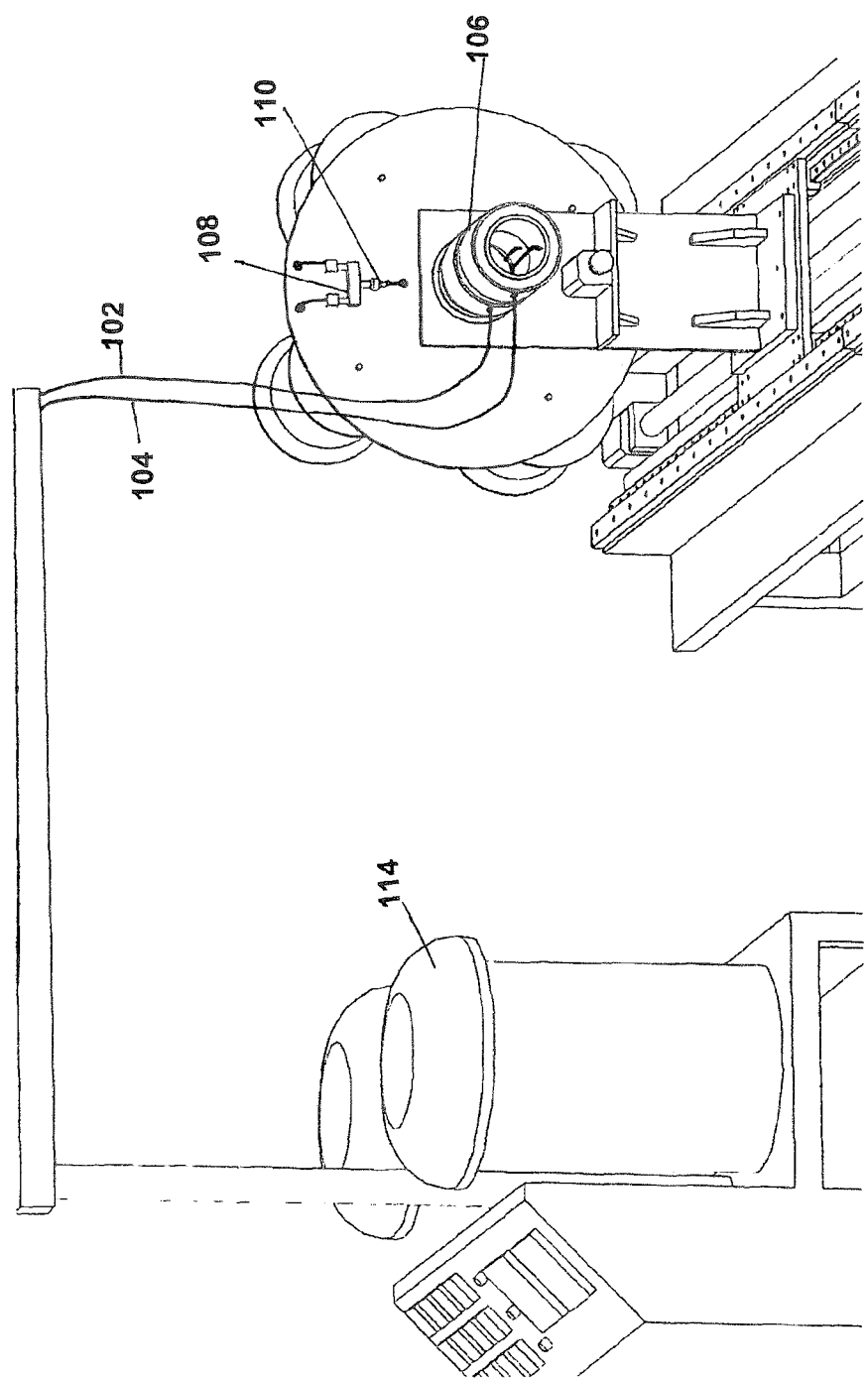
FIG. 18 is a back view of the ply lay-up station showing the mixing system.
Figure 19:
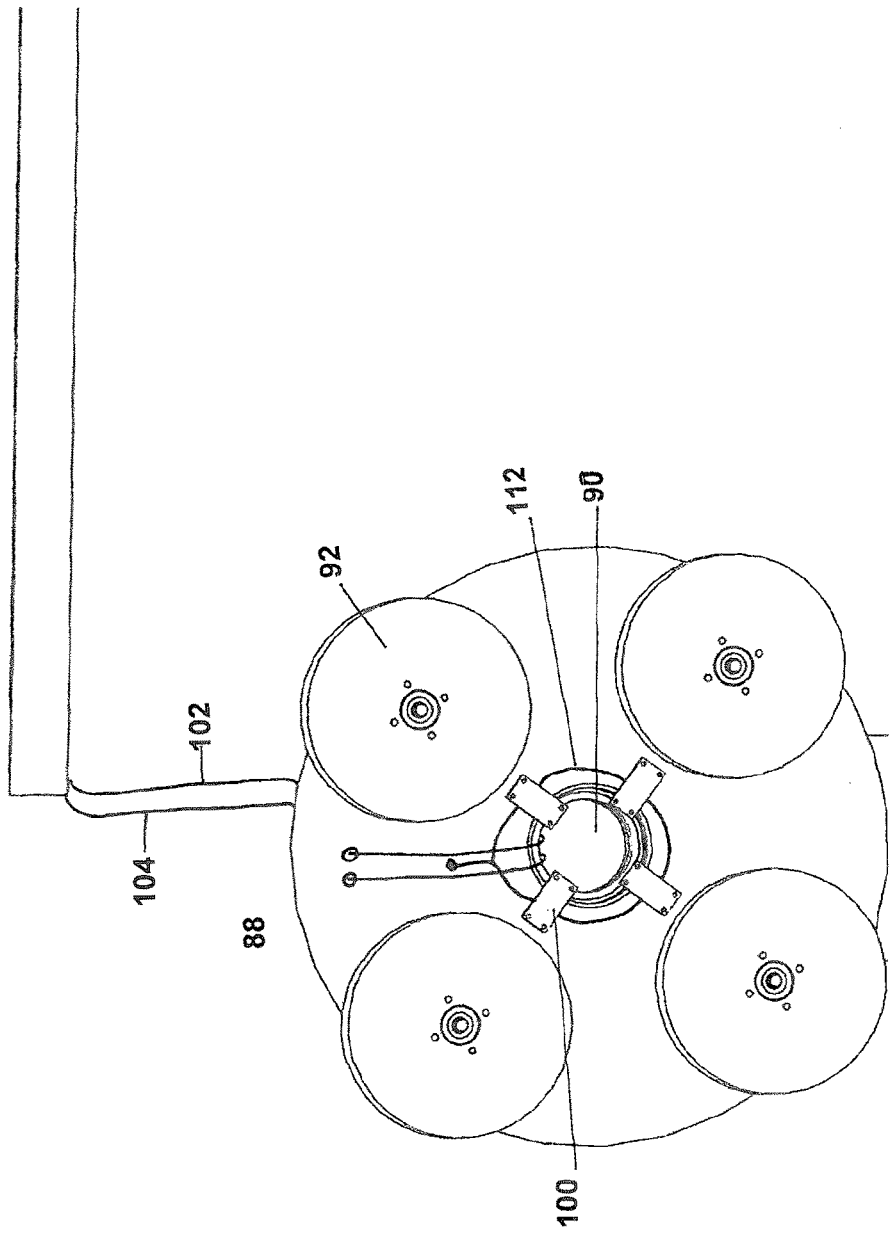
FIG. 19 is an enlarged front view of a portion of the ply lay-up station showing the mixing system.

Referring to FIGS. 17 to 19, resin is also infused into each individual roving via independent infusion blocks 100 and mixing system. The mixing system is operably connected to each independent infusion block 100. Using a two component resin (Part A=Epoxy 102, Part B=Hardener 104), the epoxy and hardener are supplied to the tombstone fixture and piped to the rotating winder plate via two custom made rotary couplers 106. The rotary couplers keep the two materials separate and allow the piping to translate from a fixed position to a rotational motion attached to the winder 88. The two part resin is then mixed on the rotating winder 88 via a resin mixer chamber 108 and pneumatic dispensing nozzle 110 that is feed via conduits 112 to each individual resin infusion block 100 per roving on the winder plate. Thus the mixing system includes a mixing chamber 108 operably connected to sources of resin and hardener and the mixing chamber 108 is operably connected to the dispensing nozzle 110 which is in turn operably connected to each individual resin infusion block 100. The resin and hardener mixture or a premix system, is supplied to the rotary couplings 106 via a positive displacement pumping resin metering machine 114 that is programmed to the proper resin/hardener ratio. The speed of rotation and the speed of the ball screw creates 98 a unique fibre layup with the center fibres running in the longitudinal direction with the outside fibres at various angles to the center fibers from 0 Deg to 90 Deg can be achieved.

Utilizing the data from a leaf spring program, the user is able to plot the thickness of the spring based on distance and thickness. This information allows the user to program the cnc controller to run the tombstone station, 30 or 80 to add fibreglass roving along the length of the spring section of the pultrusion. Thus a composite part with a variable thickness with the center of the spring being thicker than the ends is created. A variable thickness composite spring can obtain a spring rate and load carrying capacity that matches a steel leaf spring yet retains all the advantages of a composite material. As the aluminum plate rotates in the y-direction, the tombstone station 30 or 80 itself is traveling in the x-direction.

The embodiments of the leaf spring described herein are high quality products that have many advantages over steel leaf springs that are currently in use. The fully automated manufacturing process disclosed herein makes technologically advanced composite springs affordable and competitively priced against conventional steel springs. In one embodiment the leaf spring weighs approximately 12 pounds. Accordingly the leaf springs disclosed herein will save money in shipping costs as well they will reduce the overall vehicle weight.

Embodiment of the composite leaf springs of the present invention may have the following advantages over standard steel springs:
  Greater Fatigue Life (5-10 times dependant on model)
  Infinite Shape Memory (100%)
  Superior Dampening Characteristics
  Higher Impact Strength than steel (7 times)
  Elimination of Harmonic Whipping
  Weight Savings (78% weight savings)-*dependent on spring model
  Will never rust
  Elimination of Inter-Leaf Friction Generally speaking, the systems described herein are directed to composite leaf springs and a method of manufacturing same. As required, embodiments of the present invention are disclosed herein. However, the disclosed embodiments are merely exemplary, and it should be understood that the invention may be embodied in many various and alternative forms. The Figures are not to scale and some features may be exaggerated or minimized to show details of particular elements while related elements may have been eliminated to prevent obscuring novel aspects. Therefore, specific structural and functional details disclosed herein are not to be interpreted as limiting but merely as a basis for the claims and as a representative basis for teaching one skilled in the art to variously employ the present invention. For purposes of teaching and not limitation, the illustrated embodiments are directed to composite leaf springs and a method of making same.

As used herein, the terms "comprises" and "comprising" are to construed as being inclusive and opened rather than exclusive. Specifically, when used in this specification including the claims, the terms "comprises" and "comprising" and variations thereof mean that the specified features, steps or components are included. The terms are not to be interpreted to exclude the presence of other features, steps or components.

What is claimed is:

1. A composite leaf spring manufactured from composite material and having a variable cross sectional thickness, the leaf spring comprising:
    a pultruded core having a constant cross section along an entire longitudinal length and having a plurality of fibres that run in the longitudinal direction; and
    a preselected ply pattern wound around the pultruded core thereby providing the variable cross sectional thickness having a plurality of fibers that are at various angles from 0 deg to 90 deg with respect to the longitudinal direction.

2. The composite leaf spring of claim 1 further including a pair of eyelets attached to either end of the composite leaf spring.

3. The composite leaf spring of claim 2 wherein the eyelets are manufactured from one of extruded aluminium and composite material.

4. The composite leaf spring of claim 2 wherein the eyelets include a separate centre bore.

5. The composite leaf spring of claim 1 further including pair of plates attached to the composite leaf spring generally wherein the plates are positioned generally in a longitudinal middle of the composite leaf spring.

6. The composite leaf spring of claim 1 wherein the fibres are chosen from a group consisting of fibreglass, carbon fibre, basalt fibres, ceramic fibres piezoelectric fibres and a combination thereof.

7. The composite leaf spring of claim 1 wherein at least a portion of the plurality of fibres include piezoelectric fibres and the piezoelectric fibres are operably connected to a source of electric current.

8. A method of making a composite leaf spring comprising the steps of:
    die forming a spring core having a constant cross section and a plurality of fibers along a longitudinal axis of the spring core by pultrusion;
    winding fibre onto the spring core at various angles from 0 deg to 90 deg with respect to the longitudinal axis to form a spring having a variable cross section; and
    cutting the spring to a predetermined length.

9. The method of claim 8 further including the step of placing the spring in a press mold to form a shaped spring that is shaped along the longitudinal axis.

10. The method of claim 9 wherein the press mold also molds the variable cross section of the spring.

11. A flexible die forming method comprising the steps of:
    die forming a core having a constant cross section and a plurality of fibers along a longitudinal axis of the core by pultrusion;
    winding fibre onto the core at various angles from 0 deg to 90 deg with respect to the longitudinal axis to make a workpiece of a variable cross section; and
    cutting the workpiece to a predetermined length.

12. The method of claim 11 further including the step of placing the workpiece in a press mold to form a shaped workpiece that is shaped along the longitudinal axis.

13. The method of claim 12 wherein the press mold also molds the variable cross section of the workpiece.

\* \* \* \* \*